United States Patent [19]

Lepselter et al.

[11] Patent Number: 5,020,083
[45] Date of Patent: May 28, 1991

[54] X-RAY MASKS, THEIR FABRICATION AND USE

[75] Inventors: Martin P. Lepselter, Summit; Herbert A. Waggener, Pottersville, both of N.J.

[73] Assignee: Lepton Inc., Murry Hill, N.J.

[21] Appl. No.: 354,408

[22] Filed: May 19, 1989

Related U.S. Application Data

[63] Continuation-in-part of Ser. No. 341,616, Apr. 21, 1989.

[51] Int. Cl.⁵ ............................................. G21K 5/00
[52] U.S. Cl. ........................................ 378/35; 430/5
[58] Field of Search ....................... 378/34, 35; 430/5

[56] References Cited

U.S. PATENT DOCUMENTS

| | | | |
|---|---|---|---|
| 4,018,938 | 4/1977 | Feder et al. | 378/35 |
| 4,393,127 | 7/1983 | Greschner et al. | 378/161 |
| 4,401,738 | 8/1983 | Iwamatsu | 378/35 |
| 4,451,544 | 5/1984 | Kawabuchi | 378/35 |
| 4,661,426 | 4/1987 | Matsuda et al. | 430/5 |
| 4,738,907 | 4/1988 | Shigetomi et al. | 430/5 |
| 4,780,382 | 10/1988 | Stengl et al. | 378/34 |
| 4,792,461 | 12/1988 | Watakabe et al. | 427/38 |

Primary Examiner—Craig E. Church
Attorney, Agent, or Firm—Stanger, Michaelson, Spivak & Wallace

[57] ABSTRACT

An X-ray mask for manufacturing chips is produced by forming an X-ray transparent semiconductor membrane with gaps and including X-ray transparent material in the gaps. In one embodiment the opaque material is formed by sputtering Pt onto the semiconductor material to form Pt silicides in the gaps. In another embodiment the semiconductor material is exposed to W in a silane mixture and the W replaces the semiconductor material so that the W projects into the material.

6 Claims, 5 Drawing Sheets

STEPS 1 TO 6

STEPS 7 AND 8

STEP 9

STEP 10

X-RAY MASKS, THEIR FABRICATION AND USE

RELATED APPLICATIONS

This is a continuation-in-part of our copending application Ser. No. 341,616, filed Apr. 21, 1989, in the name of the same applicants as this application.

BACKGROUND OF THE INVENTION

This Invention relates to manufacture of semiconductor chips using X-rays, and particularly to the fabrication of patterned membrane X-ray masks and their use.

Forming patterned images on semiconductor chips with X-rays through X-ray masks offers a number of advantages. X-rays can form more precise images than visible or ultra-violet light because they do not suffer as much diffraction as the latter. X-ray images are thus more precise than other images and avoid the imperfections that can ruin a chip. As is known, a single imperfection can ruin a semiconductor chip, and the use of X-rays increases the statistical yields of perfect chips. X-rays also may make increased packing densities possible.

Patterned X-ray membrane masks are used to form images with X-rays. In the past, such patterned X-ray membrane masks have been manufactured by depositing X-ray absorbing materials such as tantalum, gold, tungsten, etc. on the surfaces of silicon membranes.

While such patterned membrane X-ray masks have proven successful for many applications, they exhibit a number of disadvantages, both in fabrication and use.

OBJECTS AND SUMMARY OF THE INVENTION

An object of the invention is to improve X-ray masks, their fabrication, and use.

According to a feature of this invention, these objects are attained in whole or in part, by fabricating the masks so that the X-ray absorbing materials penetrate into the X-ray transparent silicon membrane.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
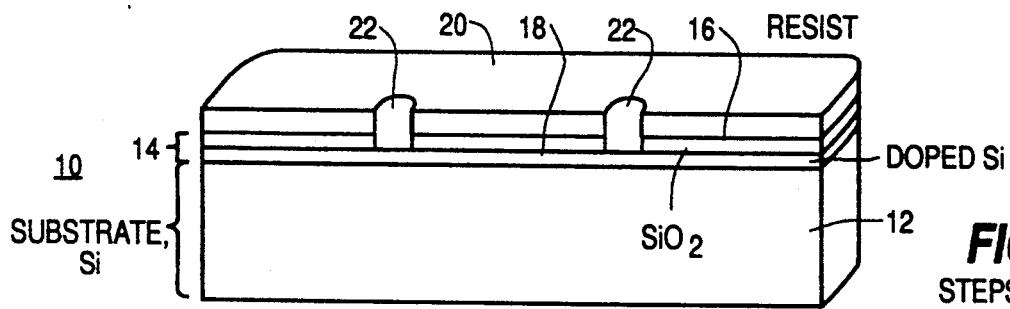
FIG. 1 is a partially perspective sectional view of an intermediate structure in the production of one embodiment of a patterned membrane X-ray mask according to the invention.

FIG. 1 shows an intermediate structure in the production of one embodiment of the membrane according to the invention. Here, a wafer 10 includes a monocrystalline silicon substrate 12 and an upper region 14 which is 1 to 2 microns deep. The upper portion of the region 14 contains a silicon dioxide stratum 16 deposited or grown to a depth of 100 Angstroms to several thousand (e.g. 3000) Angstroms, and a lower stratum 18 of heavily boron-doped silicon. An etched resist 20 and the oxide stratum 16 contain patterned recesses 22.

The structure of FIG. 1 is prepared by (1) forming the monocrystalline silicon wafer 10 with a 1,0,0 orientation; (2) forming the heavily boron-doped stratum 18, about $10^{20}$/cc, in the upper surface of the wafer 10 by ion implantation or diffussion to a depth of 1 micron or 2 microns (depending on the desired thickness of the membrane to be produced); (3) creating the silicon dioxide stratum 16 to a depth of 100 Angstroms to several thousand Angstroms on the upper surface of the doped region 14 by heating in an oxygen or steam atmosphere so as to grow the oxide stratum 16 from the stratum 18, or by vapor depositing the oxide stratum 16 on the stratum 18; (4) applying the resist 20 over the silicon dioxide stratum 16; (5) generating a latent chemical image in the form of a pattern in the shape of recesses 22 in the resist 20; and (6) etching the pattern through the oxide stratum 16.

Figure 2:
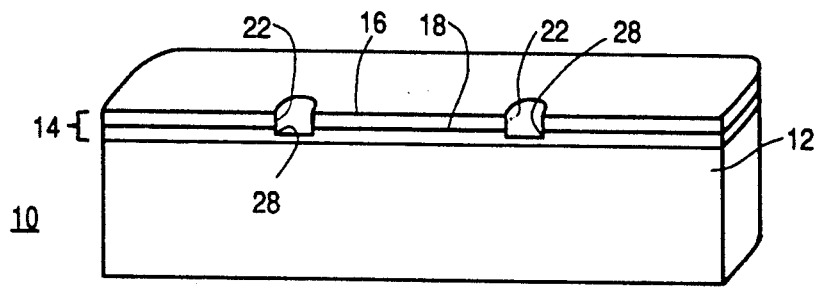
FIG. 2 is a sectional view of another intermediate structure in a later stage of the production of the membrane according to the invention.

The fabricating process then converts the wafer 10 to the condition shown in FIG. 2. This is done by (7) stripping the resist 20 and cleaning the wafer 10 to expose the oxide stratum 16 with its recesses 22; and (8) "trenching" the patterned recesses 22 into the doped silicon stratum 18 in a reactive ion etching (RIE) machine to a depth less than the depth of the stratum 18. This produces the "trenches" 28 in the shape of the patterned recesses 22 in the stratum 18. The resulting etched wafer 10 includes the substrate 12 which supports pattern etched strata 16 and 18.

Figure 3:
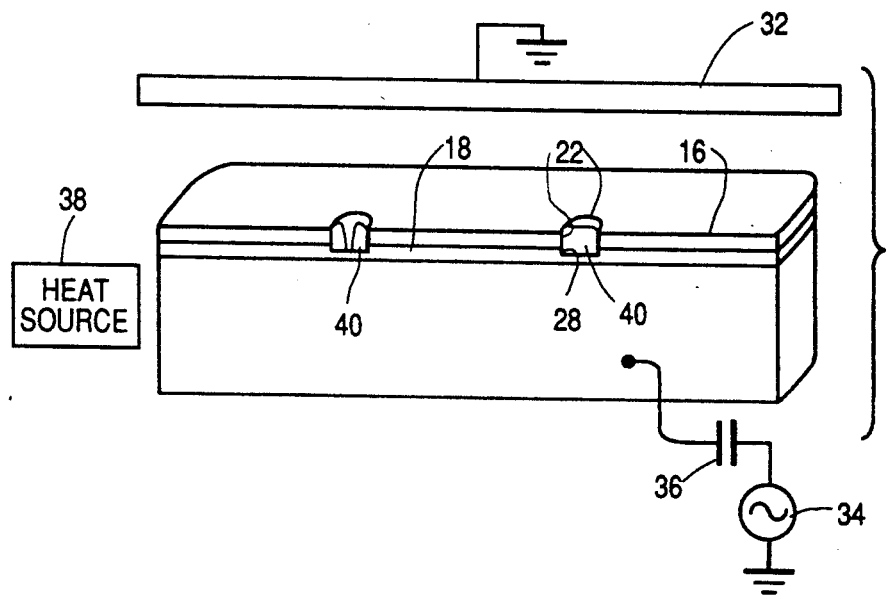
FIG. 3 is a sectional view of an arrangement for sputter depositing platinum into patterned recesses of the intermediate structure for the manufacture of the membrane according to the invention.

The process continues by (9) simultaneously sputter depositing platinum into, and back sputtering platinum from, the recesses 22 and trenches 28 at about 350° C. to 600° C. in an Argon atmosphere as shown in FIG. 3. Here, a platinum "cathode" 32 faces the stratum 16 and a voltage source 34 applies an RF potential between the cathode and the wafer 10 through a capacitor 36. A heat source 38 heats the wafer 10, the cathode 32 to about 350° C. to 600° C. Depending on the temperature and voltage, platinum sputters from the cathode 32 onto the upper surfaces of the wafer 30 and then back sputters onto the platinum cathode 32. The term "cathode" is used to describe the platinum source 32 even though the voltage actually applied is RF. The circuit partially rectifies the applied RF voltage. It generates a DC voltage of 25 v to 250 v. The applied voltage varies the sputtering rate from the platinum cathode and the back sputtering rate from the wafer 10 surface.

In FIG. 3, the voltage is selected to establish a back sputtering rate equal to the sputtering rate. This keeps the silicon dioxide surface of the stratum 16 clear of platinum. However, sputtering platinum onto the walls of the silicon trenches 28 in the stratum 18 causes formation of platinum silicides PtSi and PtSi$_2$ 40, which line the trench walls. The formation of platinum silicides 40 continues during sputtering until the silicides fill and overflow the trenches 28. The back sputtering prevents deposition of platinum on the surface of the oxide stratum 16.

Figure 4:
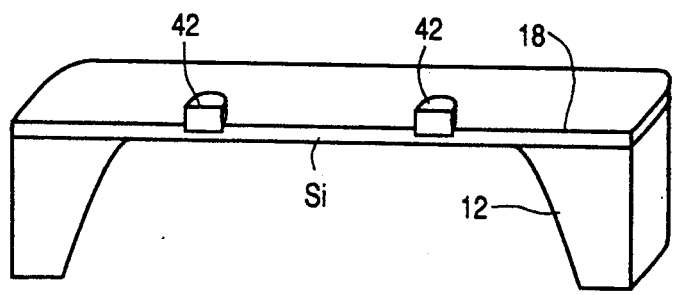
FIG. 4 is a partly perspective cross-sectional view of a patterned membrane X-ray mask embodying the invention.

The fabricating process then resumes with (10) etching away the substrate 12 and the SiO$_2$ layer 16 to obtain the membrane 44 in FIG. 4. The membrane 44 includes platinum free surfaces on X-ray transparent, boron-doped, stratum 18, and X-ray opaque protrusion 42 of silicides 40 following the shape of the pattern on the resist 20. This makes the membrane 44 eminently suitable for creating densely packed patterns on semiconductor chips.

Figure 5:
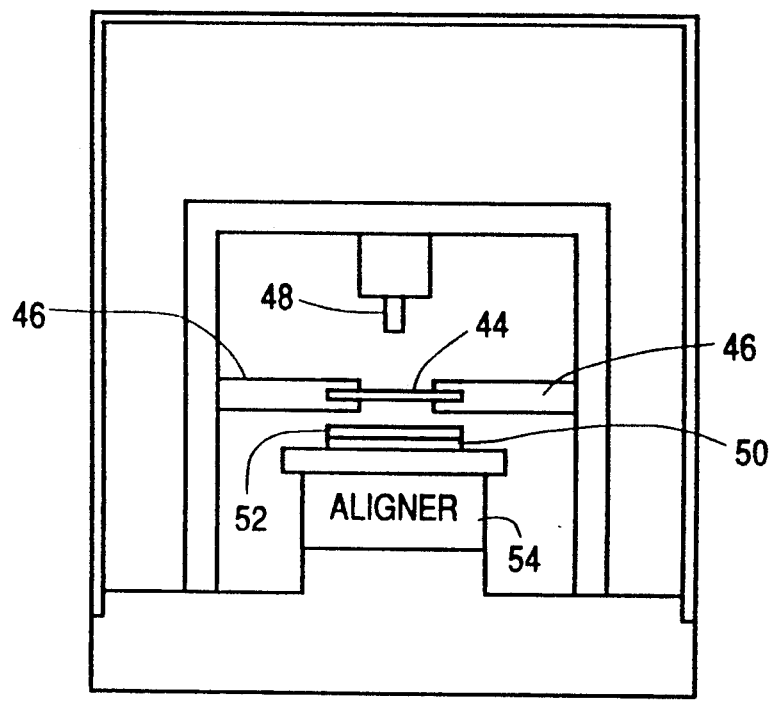
FIG. 5 is a partially perspective and partially sectional view of another patterned membrane X-ray mask embodying the invention.

FIG. 5 illustrates the use of the membrane 44 in a chip manufacturing arrangement. Here, a holder 46 positions the membrane 44 between an X-ray source 48 and a raw chip 50 having an X-ray sensitive resist 52 to produce an image pattern on the chip. An aligner 54 aligns the chip relative to the mask 44. This chip is then completed by further known steps, including diffusion and etching steps, and possibly including further exposure to X-rays through another membrane.

Figure 6:
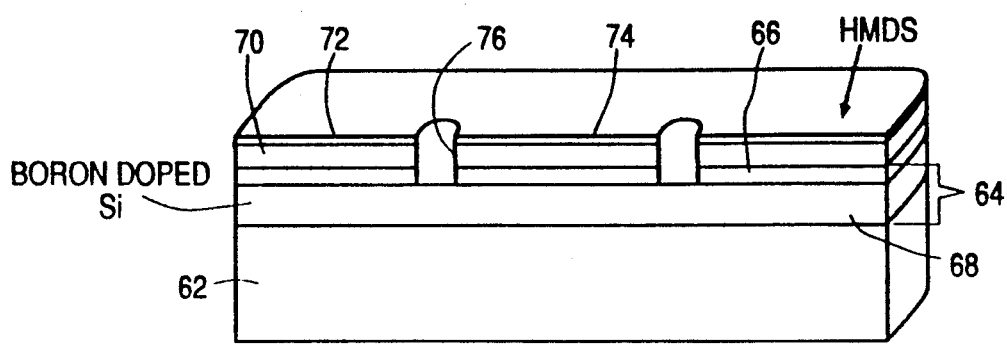
FIG. 6 is an apparatus illustrating a method of using a patterned membrane X-ray mask according to the invention.
Figure 7:
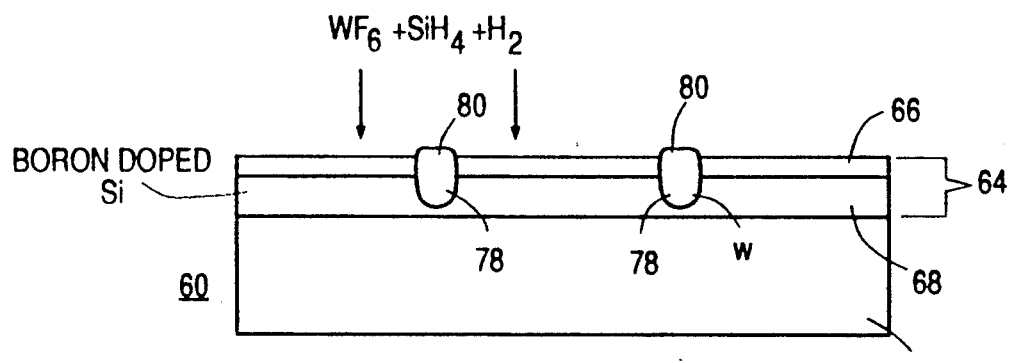
FIG. 7 is a perspective and sectional view of another intermediate structure for fabrication of another patterned membrane X-ray mask according to the invention.
Figure 8:
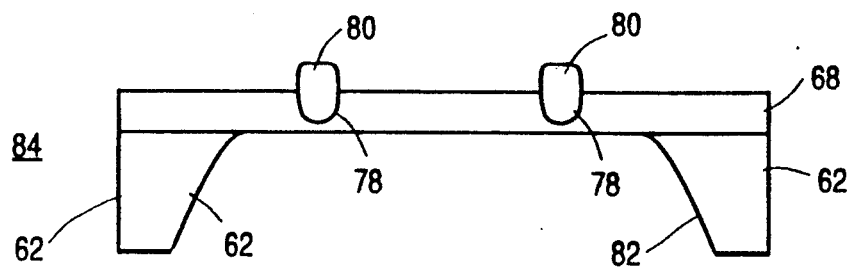
FIG. 8 is a sectional view of a patterned membrane X-ray mask according to the invention.

FIGS. 6 to 8 illustrate another process and product embodying the invention. In FIG. 6, a silicon wafer 60 includes a silicon substrate 62 supporting a region 64, 1 to 2 microns deep. The upper portion of the region 64 contains an upper silicon dioxide stratum 66 having a depth of 100 Å to 3000 Å, and a lower stratum 68 of boron-doped silicon. A resist 70 includes an upper silicon rich layer 72 in the shape of a pattern having elevations 74 and recesses 76.

The structure of FIG. 6 is prepared by: (1) forming the silicon wafer 60; (2) forming the heavily doped stratum 68, about $10^{20}$/cc, in the upper surface of the wafer 60 by ion implantation or diffussion to a depth of 1 micron to 2 microns (depending on the desired thickness of the membrane to be produced); (3) creating the silicon dioxide stratum 66 to a depth of 100 Å to 3000 Å in the upper surface of the doped region 64 by heating air in an oxygen or steam atmosphere; (4) applying the resist 70 over the silicon dioxide stratum 66; (5) forming a latent chemical "image" in the shape of a pattern with a low level electron beam; (6) exposing the latent image to a hexamethyl disilozane (HMDS) reagent to produce the silicon rich layer 72; (7) exposing the resist 70 to oxygen reactive ion etching to etch away the regions 76 not affected by HMDS. Where the resist 70 contains the silicon rich layer 72, i.e. where it is doped, the etch rate is low; the resist is not silicon rich, i.e. where it is not doped, the etch rate is high. This produces resist elevations 74 and depressions 76.

The process continues by: (8) etching through the SiO$_2$ layer 66 in an atmosphere that etches oxides, such as fluoride compounds. This results in the structure of FIG. 6.

The wafer 60 of FIG. 7 results from: (9) stripping the resist 70; (10) subjecting the wafer surface to an atmosphere of WF$_6$+SiH$_4$+H$_2$ at a temperature of 200° C. to 500° C. This deposits tungsten by displacement of Si, partially from the SiH$_4$ (silane) and partially from the silicon stratum 68, and forms tungsten penetrations 78. The WF$_6$+SiH$_4$+H$_2$ atmosphere will not replace the oxide in the stratum 66 and therefore the deposition follows the imaged pattern of the depressions 76. Once the deposition has penetrated in the stratum 68, the tungsten deposition continues upwardly and produces tungsten elevations or plugs 80.

The next steps involves: (11) stripping off the oxide stratum 66 and the main central portion 82 of the substrate 62 to form the membrane 84 in FIG. 8.

The membrane 84 is used in the same way as the membrane 44 in FIG. 5. That is, the membrane 84 is used in place of the membrane 44 of FIG. 5.

An advantage of the process in steps 6 to 8 resides in that successive steps can be carried out in a vacuum atmosphere and continue in a vacuum atmosphere.

Figure 9:
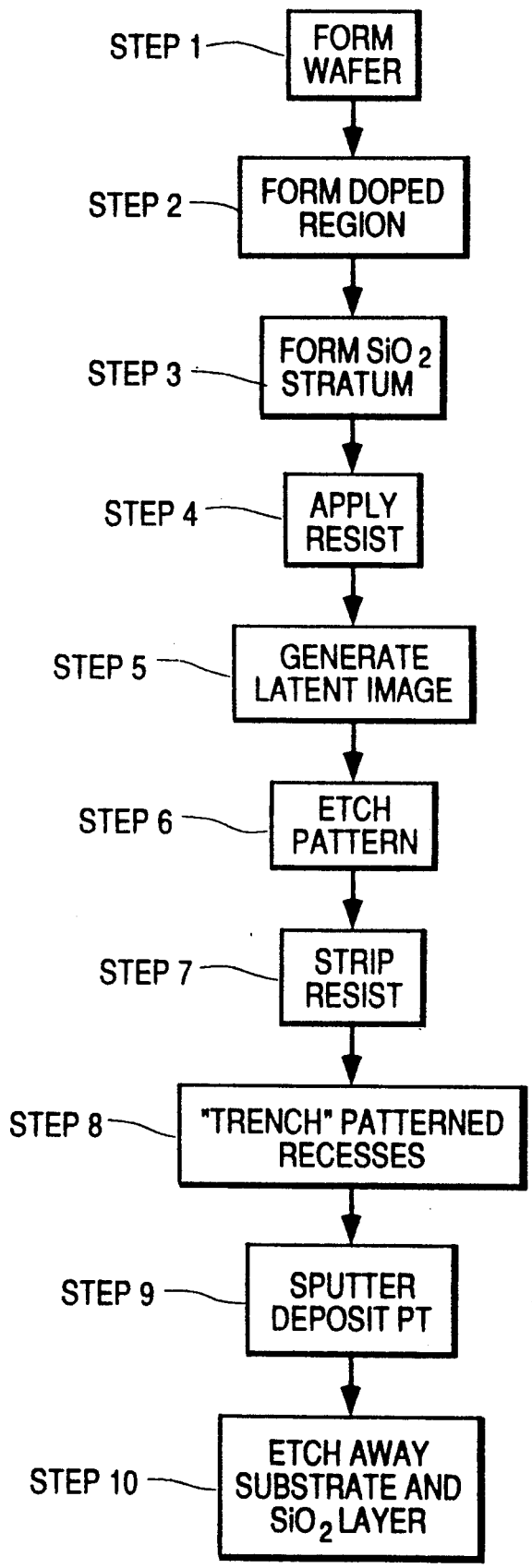
FIGS. 9 and 10 are flow charts illustrating the processes of FIGS. 1 to 4 and 6 to 8.
Figure 10:
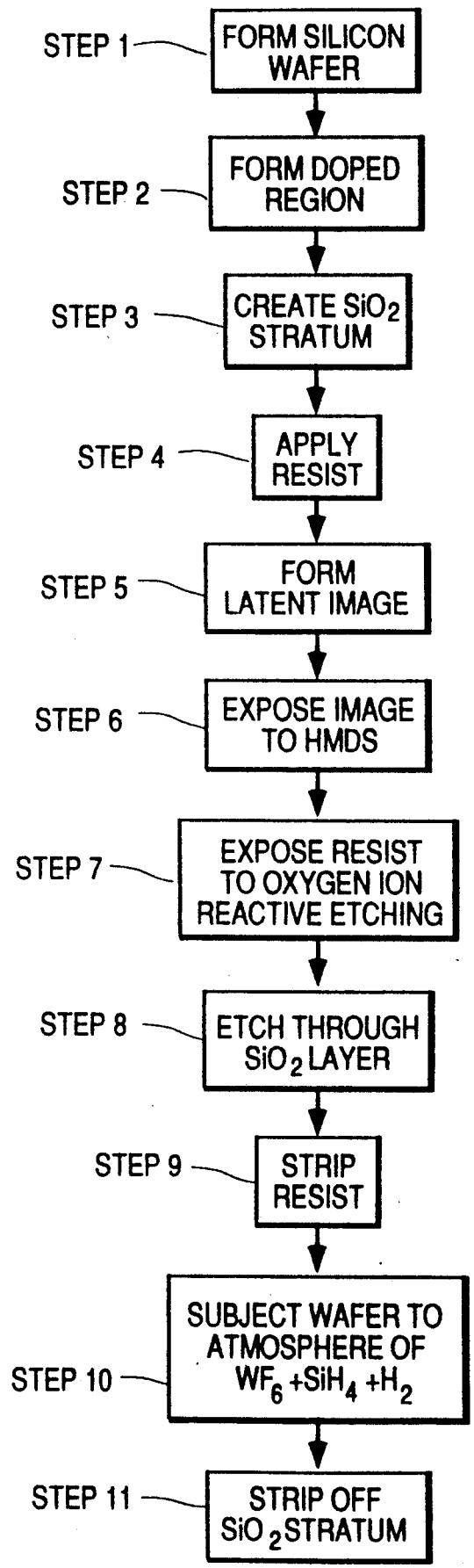

FIG. 9 is a flow chart illustrating the process shown with respect to FIGS. 1 to 4. FIG. 10 is a flow chart illustrating the process shown with respect to FIGS. 6 to 8.

While the drawings show only simple opaque protrusions 42 and plugs 80, these represent portions of complex protruding opaque patterns of the type used to form complex chips.

The latent chemical image of step 5 in both instances is produced by known means such as those using light or E-beams. The resists 20 and 70 are chosen to accommodate the known means.

While embodiments of the invention have been described in detail, these are only examples, and it will be evident to those skilled in the art that the invention may be embodied otherwise.

What is claimed is:

1. An arrangement comprising:
   a membrane of an X-ray transparent material having a first thickness;
   a structurally rigid support for holding said membrane at a portion of said membrane;
   said X-ray transparent material having a plurality of gaps extending at least partially through said membrane;
   an X-ray opaque material included within said gaps and forming a structure with said X-ray transparent material;
   said X-ray opaque material filling each of said gaps substantially entirely and extending out of said membrane.

2. An arrangement as in claim 1, wherein:
   said X-ray opaque material is a metal silicide.

3. An arrangement as in claim 1, wherein:
   said X-ray opaque material is a metal.

4. An arrangement as in claim 1, wherein:
   said gaps filled with X-ray opaque material extend only partially through said X-ray transparent material.

5. An arrangement as in claim 2, wherein:
   said gaps filled with X-ray opaque material extend only partially through said X-ray transparent material.

6. An arrangement as in claim 3, wherein:
   said gaps filled with X-ray opaque material extend only partially through said X-ray transparent material.

* * * * *